United States Patent [19]

Hendel

[11] Patent Number: 4,907,126

[45] Date of Patent: Mar. 6, 1990

[54] HOUSING FOR AN ELECTRICAL COMPONENT, PARTICULARLY FOR A RELAY

[75] Inventor: Horst Hendel, Berlin, Fed. Rep. of Germany

[73] Assignee: Siemens Aktiengesellschaft, Berlin and Munich, both of Fed. Rep. of Germany

[21] Appl. No.: 290,109

[22] PCT Filed: Nov. 6, 1987

[86] PCT No.: PCT/DE87/00502

§ 371 Date: Nov. 2, 1988

§ 102(e) Date: Nov. 2, 1988

[87] PCT Pub. No.: WO88/06800

PCT Pub. Date: Sep. 7, 1988

[30] Foreign Application Priority Data

Feb. 27, 1987 [DE] Fed. Rep. of Germany ..... 68703079

[51] Int. Cl.[4] .............................................. H05K 5/02

[52] U.S. Cl. .................................... 361/394; 335/202; 361/380; 361/392

[58] Field of Search ..................... 174/50, 50.5, 50.51; 335/106, 133, 162, 199, 202; 361/331, 380, 383-384, 392, 394, 395, 399

[56] References Cited

U.S. PATENT DOCUMENTS 4,580,005 4/1986 Minks et al. ........................ 335/202

FOREIGN PATENT DOCUMENTS 0058727 9/1982 European Pat. Off. .
2317901 10/1974 Fed. Rep. of Germany .
8017121 12/1980 Fed. Rep. of Germany .
8703079 4/1987 Fed. Rep. of Germany .

*Primary Examiner*—Gregory D. Thompson
*Attorney, Agent, or Firm*—Hill, Van Santen, Steadman & Simpson

[57] ABSTRACT

The housing cap comprises a bevel at one of its upper corners, a rib corresponding to the original housing contour projecting out of this bevel. An aeration channel that is initially closed toward the outside is situated in this rib, this aeration channel being capable of being opened from obliquely above with a diagonal cutting nipper after the washing of the relay on the printed circuit board.

6 Claims, 1 Drawing Sheet

HOUSING FOR AN ELECTRICAL COMPONENT, PARTICULARLY FOR A RELAY

BACKGROUND OF THE INVENTION

The innovation is directed to a housing for an electrical component, particularly for a relay, comprising a cuboid cap whose outside wall is set back at the upper side in the region of a corner, whereby a projection projects out at the setback wall part, a channel that is in communication with the interior of the housing but that is closed by the outside wall of the projection being formed in the projection.

It is important in such components, i.e. particularly in electro-magnetic relays, that the housing for integration on printed circuit boards be at least wash-tight so that liquids and vapors cannot penetrate into the interior and deteriorate the contact surfaces when cleaning the printed circuit boards or during other manufacturing procedures. This is usually accomplished in that a plastic cap is glued to a pedestal or to a base member, is welded thereto or is tightly connected thereto in some other way.

This termination of the housing achieved with plastic, however, can be disadvantageous for the further useful life of a relay or of a similar component under certain conditions since the plastic housing, the coil and other parts in the relay emit eliminations over the course of time that are injurious to contacting and the generate a micro-climate inside the closed housing over a longer time, this micro-climate being potentially more harmful to the contacts than the normal, outside air. It is therefore also frequently desirable to provide the housing with an aeration opening after the integration of a relay and after the washing of the printed circuit board, this aeration opening enabling a communication between the interior of the housing and the outside atmosphere and thus also creating a pressure balancing given temperature fluctuations. This, however, should be implementable in an optimally simple way; it should also be assured that no function parts are damaged or negatively affected by the introduction of the aeration opening and that no particles of plastic fall into the inside where they could deposit on the contact surfaces.

For this said purpose, it is known in a relay housing of the species initially cited (European Published Application No. 00 58 727) to set a corner at the upper side of the cap back somewhat so that a step arises, whereby a cylindrical projection having an internally disposed channel is formed on this step. The internally disposed channel can be opened toward the outside by cutting the cylindrical projection off.

This known structure, however, has the disadvantage that the offset step lies parallel to the upper side of the cap, so that a cut parallel to this upper side but at a somewhat lower position is required for cutting the projecting peg off. Given a higher packing density of relays on a printed circuit board, the projection that is to be cut off is difficult to access and can only be accessed with a special tool.

SUMMARY OF THE INVENTION

An object of the innovation is to fashion a housing of the species initially cited such that the opening of the aeration channel formed in the cap can be implemented in a simpler and more reliable way at the finished and integrated component.

In accord with the invention, this object is achieved in that the surface of the setback wall region forms an oblique plane that respectively intersects the three adjoining lateral surfaces or, respectively, the adjoining lateral edges at an oblique angle; and in that the projection rises at least partially perpendicular to the oblique plane in the central region of said oblique plane.

As a result of the innovative application of the setback region at a corner of the cap, the projection applied thereto and comprising the inwardly disposed aeration channel can be easily accessed obliquely from above, so that there is no difficulty in cutting the projection off even given high packing density on a printed circuit board. This, for example, can occur with a diagonal cutting nipper or with a knife. The application of the setback part in a corner also effects that extremely little space is lost in the inside of the cap, so that practically no space is sacrificed for the aeration opening given the miniaturization of the component.

The projection comprising the inwardly disposed channel is expediently fashioned as a rib that proceeds from the cut, vertical side edge of the cap in diagonal direction to the upper side of the cap via the oblique plane. For example, such a rib can be best cut off with a diagonal cutting nipper proceeding from above. The rib shape thereby has the further advantage that an aeration channel having a round crossection is not significantly constricted due to pinching when it is cut off.

The rib expediently has vertical sidewalls rising out of the oblique plane and its outside contour essentially corresponds to the outside edges of the remaining corners of the cap. A pleasant appearance of the component both before as well as after the rib has been cut off derives in this way. In a preferred embodiment, the oblique plane preferably forms a respective angle of about 45° relative to the adjoining late-al surfaces of the cap. It can also be provided with a notch for applying a knife, for example at its point of attachment to the upper side of the cap.

BRIEF DESCRIPTION OF THE DRAWINGS

A preferred exemplary embodiment of the invention shall be set forth in greater detail below with reference to the drawing. Shown therein are.

DESCRIPTION OF THE PRFERRED EMBODIMENT

Figure 1:
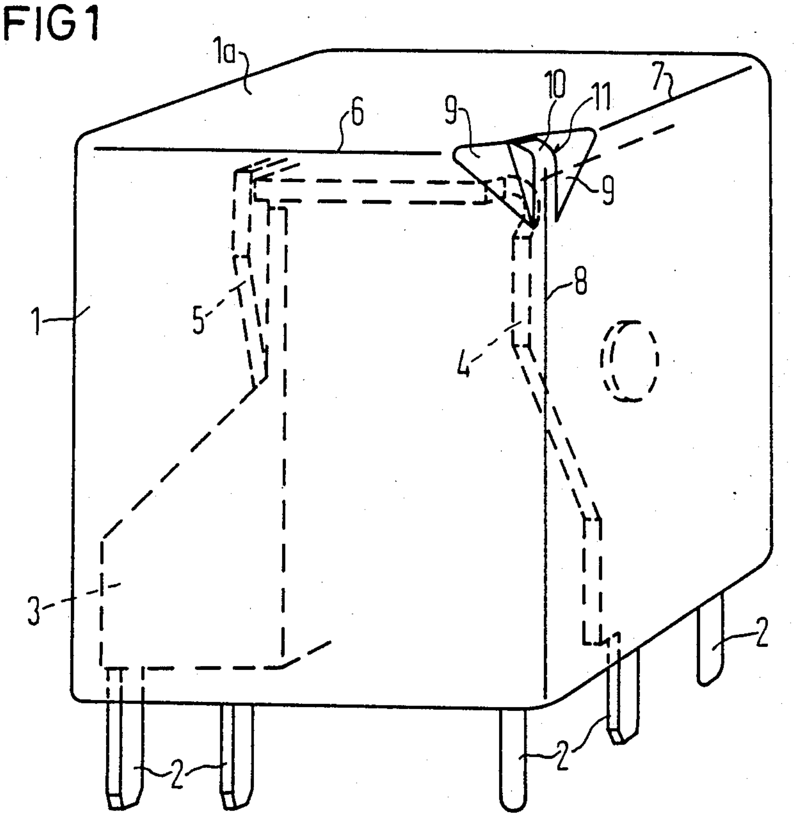
FIG. 1 a housing for a relay comprising the design of the innovation.
Figure 2:
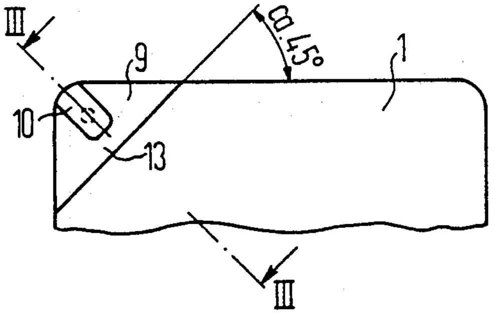
FIG. 2 a detail view from above onto a corner of the housing of FIG. 1.

FIG. 1 shows an electromagnetic relay in a closed housing, whereby only the cap 1 and the downwardly projecting terminal pins 2 of the cap can be seen. A known relay system is arranged in the interior of the housing, whereby a base body 3, a yoke 4 and an armature 5 are shown by way of suggestion. The cap 1 has its underside connected wash-tight to the base body 3 or, respectively, to a base plate in a way that is not shown in greater detail.

Figure 3:
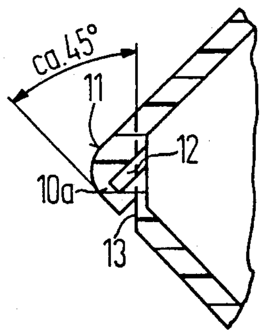
FIG. 3 a section III-III from FIG. 2.

The cap 1, which is composed of plastic, is obliquely cut at an angle of about 45° at one of its upper corners that is formed by the two upper edges 6 and 7 as well as by the vertical lateral edge 8, being cut such that an oblique plane 9 arises. As shown in FIG. 1 the cap 1 has a cuboid shape with a plurality of walls of which three adjoining walls are defined by the two upper edges 6 and 7 and the vertical lateral edge 8. One of the three adjoining walls is an upper side 1*a* of the cap 1. A rib 10 rises on this oblique plane 9 or oblique wall portion, this projection or rib 10 proceeding in extension of the lateral edge 8 and in diagonal direction toward the upper side 1*a* of the cap. This rib 10 divides the oblique surface 9 into two parts and has its lateral surfaces residing perpendicularly upon this oblique plane. The outside contour 11 of the rib 10 corresponds to the outside contours of the remaining, upper corners of the cap 1, i.e. it forms an extension of the lateral edge 8 and of the upper side 1*a* of the cap. An aeration channel 12 is formed in the inside of the rib 10, this aeration channel 12 being in communication with, that is open to, the interior of the cap 1 and being terminated toward the outside by the terminating wall 10*a* of the rib, that is by an end portion of the projection (see FIG. 3).

After the integration of the relay on a printed circuit board and after the execution of all cleaning processes or at any other later point in time as well upon utilization of the relay, the rib 10 can be cut off in order to open the aeration channel 12 and bring the interior of the housing into communiation with the outside atmosphere. For example, this can be accomplished with a diagonal cutting nipper obliquely from above. However, it is also possible to cut the rib off with a knife proceeding from this same oblique direction. In order to facilitate the application of a knife, a notch 13 is additionally formed at the upper side of the rib.

List of Reference Characters

1: Cap
1*a:* Upper side
2: Terminal pin
3: Base body
4: Yoke
5: Armature
6,7: Upper edge
8: Veritcal lateral edge
9: Oblique plane
10: Rib

10*a:* Terminating wall
11: Outside Contour
12: Aeration channel
13: Notch

I claim:

1. A housing for an electrical component, particularly for a relay, comprising a cuboid cap having a plurality of outside walls perpendicularly intersecting one another to form a cuboid configuration of said cuboid cap and to form a plurality of corners of said cuboid cap;

an upper corner defined by three adjoining walls being set back to form an oblique wall portion that intersects said three adjoining walls at an oblique angle thereto;

a projection projecting outward from said oblique wall portion, and said projection having a channel, said channel being open to an interior of said cuboid cap and being closed by an end portion of said projection.

2. A housing according to claim 1, wherein one of said three adjoining walls is an upper side (1*a*) of said cuboid cap (1) and characterized in that said projection is fashioned as a rib (10) that extends from said oblique wall portion (9) of said cap (1) in a direction diagonal to said upper side (1*a*) of said cap.

3. A housing according to claim 2, characterized in that said rib (10) extends from said oblique wall portion (9).

4. A housing according to claim 2, characterized in that an outside contour (11) of said rib essentially corresponds to the outside contours of the remaining corners of said cap (1).

5. A housing according to claim 1, characterized in that said oblique wall portion forms a respective angle of about 45° relative to said three adjoining walls of said cap (1).

6. A housing according to claim 2, characterized in that said rib comprises a notch (13) in its outside contour.

* * * * *